US006505705B1

(12) United States Patent
Espiritu et al.

(10) Patent No.: US 6,505,705 B1
(45) Date of Patent: Jan. 14, 2003

(54) COMPACT VEHICULAR LOUDSPEAKER WITH DUAL-STANDARD MOUNTING SYSTEM

(75) Inventors: Ronnie S. Espiritu, Castaic, CA (US); Jerry Moro, Moorpark, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 09/626,502

(22) Filed: Jul. 27, 2000

Related U.S. Application Data

(60) Provisional application No. 60/145,817, filed on Jul. 27, 1999.

(51) Int. Cl.[7] .................................................. H05K 5/00

(52) U.S. Cl. ........................................ 181/150; 381/386

(58) Field of Search ................................. 181/150, 141, 181/199; 381/386, 389, 395, 398

(56) References Cited

U.S. PATENT DOCUMENTS 4,032,725 A 6/1977 McGee
4,815,558 A 3/1989 Krainhofer
4,852,178 A 7/1989 Inkman et al.
4,853,966 A * 8/1989 Skrzycki ..................... 181/150
5,739,480 A 4/1998 Lin
5,867,583 A * 2/1999 Hazelwood et al. ........ 181/199

* cited by examiner

*Primary Examiner*—Robert E. Nappi
*Assistant Examiner*—Edgardo San Martin
(74) *Attorney, Agent, or Firm*—Sonnenschein Nath & Rosenthal

(57) ABSTRACT

A compact speaker is enabled to mount into panels made with either of two different sized standard mounting cutout patterns, e.g. Japanese JIS or the larger European DIN, providing the small JIS overall basket diameter along with an unusually large effective cone "air piston" diameter with full excursion for enhanced low frequency response. For mounting to a JIS-configured panel, an annular adaptor ring is configured with an array of four mounting screw clearance holes in a JIS pattern by which the ring is attached to the panel, and four threaded holes on a larger circle by which the basket is then attached to the ring by relatively small sized machine screws. For mounting to a DIN-configured panel, the adaptor ring is not used: the plastic basket is configured with four extending ears providing clearance mounting holes at DIN mounting locations for self-tapping screws by which the speaker is mounted to the DIN-type panel. The ears are made such that for JIS mounting, where they are not used, they can be snapped off and removed to avoid interference with close surroundings.

21 Claims, 7 Drawing Sheets

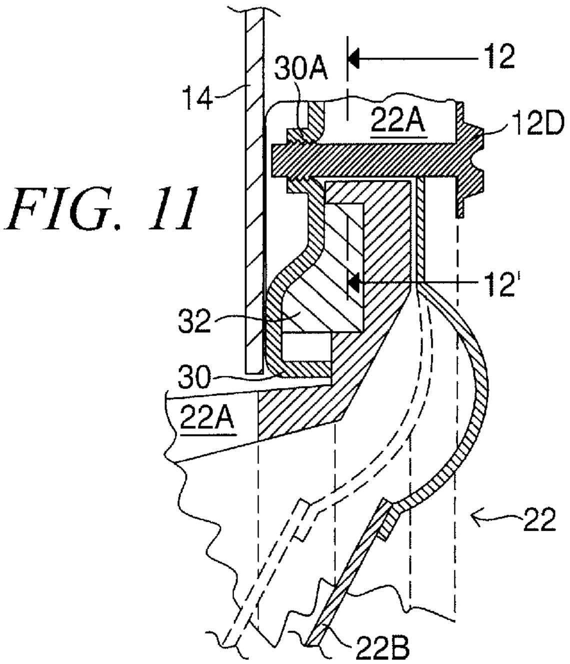
FIG. 11
FIG. 12
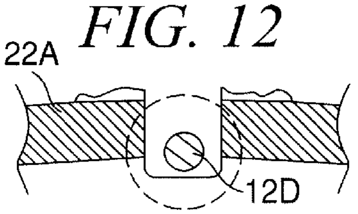
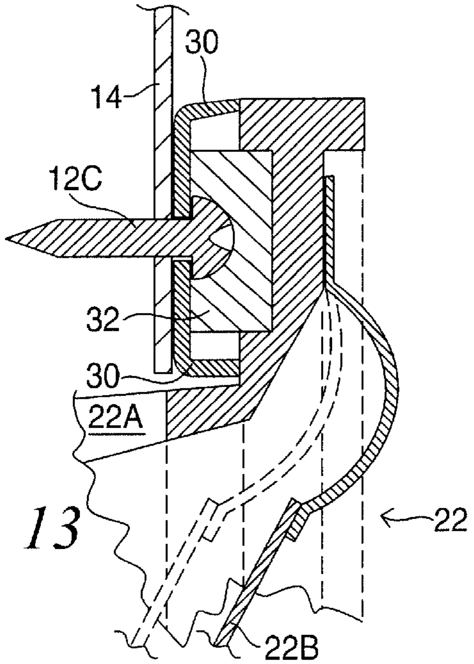
FIG. 13
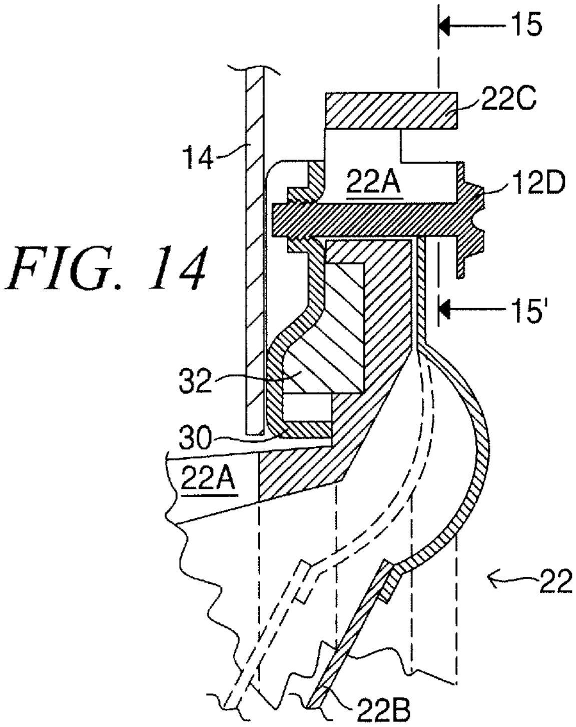
FIG. 14
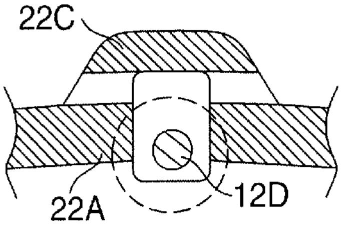
FIG. 15

COMPACT VEHICULAR LOUDSPEAKER WITH DUAL-STANDARD MOUNTING SYSTEM

PRIORITY

Benefit is claimed under 35 U.S.C. §119(e) of provisional application 60/145,817 filed Jul. 27, 1999.

FIELD OF THE INVENTION

The present invention relates to the field of audio loudspeakers, and more particularly to vehicular speakers of a popular compact size category directed to but not restricted to after-market replacement units.

BACKGROUND OF THE INVENTION

Speakers are categorized mechanically by outside basket dimensions and characterized functionally by diaphragm size since generally low frequency performance is determined mainly by diaphragm area and excursion capability, i.e. the volume of air moved by the diaphragm acting as a piston.

Vehicular speakers are generally designed to mechanically fit a particular mounting pattern used by vehicle manufacturers, typically including a main cutout and three, four or six surrounding mounting holes, dimensioned according to standards originating from different world regions. Replacement speakers are generally required to fit the mounting pattern and space originally provided in the vehicle, preferably without any extra drilling or other rework of the vehicle.

As is conventionally known, the Japanese Industrial Standards Committee (JISC or JIS) is a Japanese agency that establishes and maintains standards for equipment and components. Moreover, Deutsches Institut für Normung e.V. (DIN) is the German Institute for Standardization. Together with its subsidiaries, DIN is dedicated to providing the whole range of services that support the development, distribution, and application of standards.

Round speakers having basket diameter in the 6" to 7" size range are in extremely high quantity vehicular usage in the U.S. and throughout the world. Most of these are made to either a JIS Japanese standard that specifies 6.18 inches (157 mm) diameter or a DIN German standard used in Europe that specifies 6.69 inches (170 mm) diameter.

Other key dimensions found in speakers made to these standards are shown the following table:

TABLE 1

"6 ½" SPEAKER VERSIONS
Diameter dimensions in millimeters:

| Version | Cone | Effective Diaphragm | Mounting Array | Basket |
|---|---|---|---|---|
| JIS Japan | a) 111.8 | 121 | 142 | 157 |
| | b) 115.3 | 126 | 142 | 157 |
| DIN Europe | 119.3 | 131 | 157 | 170 |

Manufacturers, distributors and dealers providing replacement vehicular speakers are ordinarily required to handle two different speaker models, one for each of these standards, and each having its corresponding mounting pattern, depending on the vehicle make, year and model, even though these dimensions The DIN version is too large to fit into a JIS mounting pattern without extensive mechanical rework of the vehicle panel.

The JIS version, being the smaller of the two, has less diaphragm area and suffers a corresponding disadvantage regarding bass performance; this rules out the approach of simply mounting the smaller JIS speaker in the larger DIN mounting pattern with some form of mechanical adaptation.

A true dual-mounting-standard unit able to replace either of these types in a fully satisfactory interchangeable manner would yield substantial cost savings to manufacturers, distributors and dealers by reducing the inventory normally required to support these two slightly different types. The dual-mounting-standard replacement would be required to at least equal the bass performance of the larger sized DIN type while being able to mount readily in the smaller-sized JIS mounting pattern as well as in the larger-sized DIN mounting pattern.

The two major problems addressed by the present invention can be summarized as follows:

1) the JIS mounting problem: when the JIS smaller-sized speaker basket is fitted with a larger DIN-sized cone, the JIS mounting holes are no long available, being covered by the surround suspension flange and thus the holes are no longer available without degradation of the surround flange and its adhesive fastening to the basket flange, therefore an alternate fastening method is required for mounting the speaker to a JIS-configured vehicle panel: and 2) the DIN mounting problem: the four holes in the DIN mounting pattern fall directly on the diameter of the JIS basket, complicating mounting to a DIN-configured panel.

DISCUSSION OF RELATED KNOWN ART

U.S. Pat. No. 5,867,583 to inventors Hazelwood, Espiritu and Jorgensen for TWIST-LOCK MOUNTABLE VERSATILE LOUDSPEAKER MOUNT is incorporated by reference into the present disclosure. The '583 patent discloses a versatile JIS/DIN compatible dual-standard speaker that addresses the JIS mounting problem by utilizing an adaptor ring that mounts to a JIS-configured panel with screws and that is formed to provide four lock tabs by which the speaker basket is attached in a twist-lock/snap manner via rim slots, thus the speaker can be installed and removed without screws. '583 addresses the DIN mounting problem (a) in the same manner, making the adaptor ring large enough to also provide DIN-configuration mounting holes or (b) by notching the speaker rim in four places and bridging each notch with a metal saddle clip that enables a self-tapping mounting screw to secure the rim to the DIN panel.

The present disclosure departs from '583 in proposing a "dual-standard replacement speaker" utilizing alternative novel solutions to the JIS and DIN mounting problems that may be applied to a plastic basket as well as to a metal basket, and that utilize screw fastenings exclusively rather than snap/twist-lock tabs and/or saddle clips.

The '583 patent cites as other examples of loudspeaker mounting systems that directed to quick mounting of compact round speakers in cut-outs of various existing panels: U.S. Pat. No. 4,815,558 to Krainhofer, assigned to U.S. Philips Corp., and 4,852,178 to Inkman et al, assigned to Motorola, Inc. These, while not necessarily directed expressly to dual-standard dual-standard compatibility, are of interest in disclosing quick-fastening speaker retaining assemblies comprising an intermediate support member such as a plate fitted with a plurality of latched posts which become engaged with a ring frame placed over the speakers and rotated to retain the speaker against the frame and the plate in a twist-lock manner.

OBJECTS OF THE INVENTION

It is a primary object of the present invention to provide a versatile mounting system for a dual-standard replacement speaker that enables convenient mounting into either of two slightly different-sized mounting patterns, including the main cutout and screw holes, such that the dual-standard replacement speaker can readily replace either of two different and ordinarily non-interchangeable speaker types.

It is a further object that the dual-standard speaker be made to provide a level of performance quality that equals or exceeds that of either of the two original speaker versions, particularly with regard to low frequency performance.

It is an object to provide, as a particular embodiment of the invention, a dual-standard round speaker for replacing vehicular speakers in the 5" to 6" range, that can be readily mounted into either of two popular speaker-to-vehicle mounting versions: the Japanese JIS version and the European DIN version.

It is another object to provide a replacement vehicular speaker with a rim configuration and a diaphragm surround suspension configuration that provides a ratio of effective diaphragm diameter to outside basket diameter that is higher than such ratio found in conventional speakers of known art.

It is a further object to solve both the JIS and the DIN mounting problems of a dual-standard speaker in both plastic and metal speaker basket implementations.

SUMMARY OF THE INVENTION

The above mentioned objects have been accomplished by the subject speaker of the present invention by utilizing an oversized diaphragm, intended for the larger of the two speaker versions, specially mounted on a basket intended for the smaller of the two speaker versions, with special mounting to the basket rim that ensures full diaphragm excursion.

The basket may be stamped from metal, similar to the conventional JIS speakers, or it may be cast from metal or molded from suitable plastic material: in any cases the nominal outside diameter will be made 157 mm so that the small size remains compatible with the JIS mounting hole array.

To enable mounting to a JIS-configured panel, an annular doubly-flanged sheet metal adaptor ring is formed with four raised regions at DIN mounting hole locations near the outer diameter, each configured with a hole, preferably extruded, that is threaded to engage a achene screw. The adaptor ring is also configured with an array of four mounting screw clearance holes in a JIS polar array pattern, offset from the four threaded holes in the raised regions, by which the adaptor ring is first secured by four self-tapping screws to the JIS-type panel, following which the plastic or metal basket is attached to the ring via the four relatively small sized machine screws. For mounting to a DIN-configured panel, the adaptor ring is not used: the plastic basket is configured with four extending ears providing clearance mounting holes at DIN mounting locations for self tapping screws which secure the basket to the DIN-type panel.

In the case of a metal basket, in a preferred embodiment the outer basket rim is configured with four notches cut out and extending ears with holes to accommodate self-tapping screws, located at DIN mounting locations.

In both plastic and metal implementations, the ears are made such that, particularly for JIS mounting where they are not needed, they can be snapped off and removed if necessary for clearance in tight surroundings.

Referring to TABLE 1, it is estimated that the 119.3 mm DIN cone provides an effective air piston with about 17% more area than the 111.8 mm JIS(a) cone. Practice of the present invention has enabled the cone size to be increased to at least 124 mm, thus providing about 8% more effective area than the DIN cone.

BRIEF DESCRIPTION OF THE DRAWINGS

The above and further objects, features and advantages of the present invention will be more fully understood from the following description taken with the accompanying drawings in which:

FIG. 11 is a cross-section taken at axis 11–11' of FIG. 10 at a basket-mounting machine screw location.

FIG. 12 is a cross-section taken at axis 12–12' of FIG. 11 showing the remaining groove at the mounting machine screw location after removal of the mounting ear.

FIG. 13 is a cross-section taken at axis 13–13' of FIG. 10 through a ring-mounting self-tapping screw.

FIGS. 14 and 15 replicate FIGS. 11 and 12 respectively, but with the mounting ear remaining in place.

DETAILED DESCRIPTION

Figure 1:
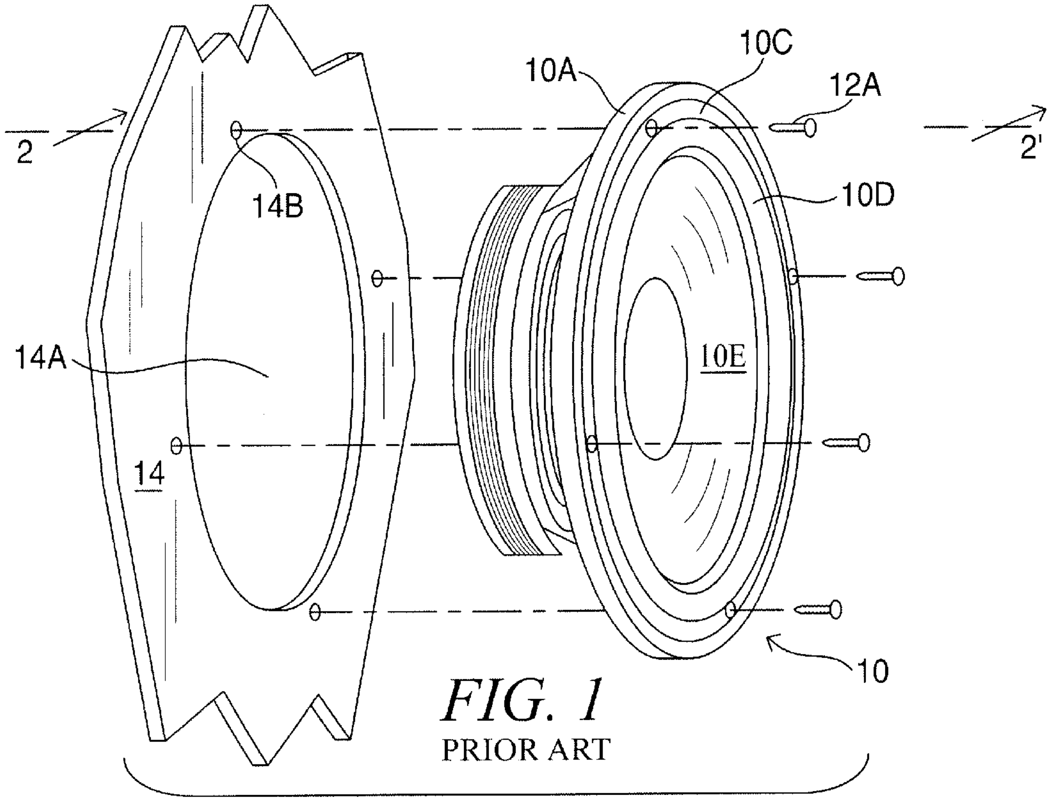
FIG. 1 PRIOR ART
FIG. 1 is a three-dimensional view of a round speaker of known art utilizing a JIS-type undersized "6½ inch" metal basket, shown in pre-installation relationship with a JIS-configured panel and mounting screws.

FIG. 1 is a three-dimensional view of a round speaker 10 of known art having a JIS-sized press-formed sheet metal basket 10A, shown at pre-installation with a vehicular panel 14 which is configured according to JIS specifications with the main circular cutout 14A and four associated mounting holes 14B (e.g. pilot holes for self-tapping screws) in a polar array to match speaker 10, typically via four self-tapping screws 12 passing through the speaker mounting holes and engaging the corresponding holes 14B in panel 14, which represents a structural panel in a vehicle or a removable sub-panel provided in the vehicle.

Figure 2:
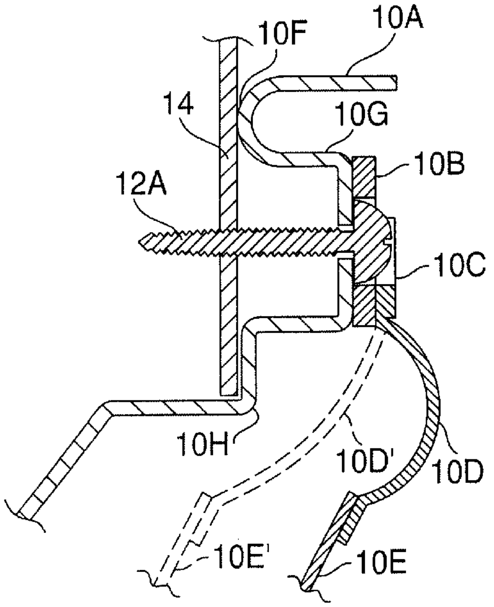
FIG. 2 PRIOR ART
FIG. 2 is an enlarged cross section of an edge region taken at axis 2–2' of FIG. 1 with the speaker assembled to the panel.

FIG. 2 is an enlarged cross-section of an edge region of the speaker and panel of FIG. 1 after installation, taken through a mounting screw 12 at axis 2–2' of FIG. 1.

The speaker edge region includes an outer rim 10A forming one wall of a U-shaped channel with a rounded bottom 10F bearing against the front side of panel 14. The channel's opposite wall 10G supports a flat landing region carrying an outer surround flange 10C extending from the main resilient arched portion of suspension 10D. The outer surround flange 10C is adhesively attached, optionally via a spacer 10B, to the landing region, and the inner surround flange is attached to the outer edge of the speaker cone 10E.

Figure 3:
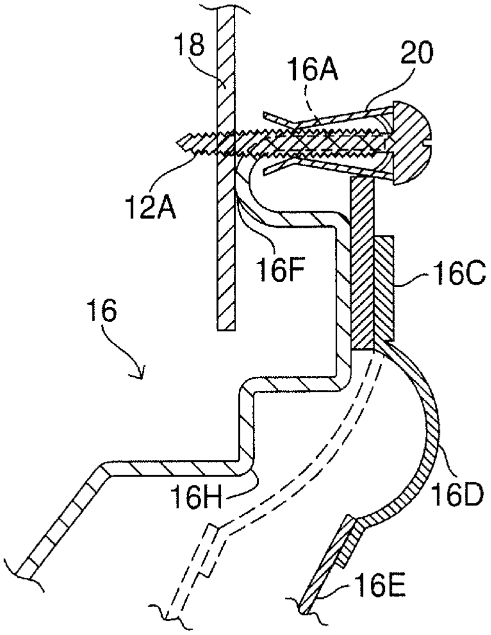
FIG. 3 PRIOR ART
FIG. 3 is a cross section of an edge region of a previously disclosed speaker having a JIS-sized metal basket as in FIG. 1, but modified with rim cutouts and fitted with a DIN-sized cone, shown mounted to a DIN-configured panel via spring metal saddle clips.

FIG. 3 is an enlarged cross-section taken through a mounting screw 16A of an embodiment of a versatile speaker 16, as disclosed in the above-mentioned '583 patent, having a JIS-sized basket 16H and a DIN-sized cone 16E, shown mounted to a DIN-configured panel 18. The JIS basket 16H is similar to the basket 10H (FIG. 2), but modified with cutaway notches (see FIG. 9 of the '583 patent) configured at four mounting locations around the rim flange 16F to accommodate screws 16A for the mounting speaker 16 in the mounting holes of a DIN-configured panel 18. The "oversized" cone 16E has a diameter of 119.3 mm, as normally utilized in DIN-sized speakers, to enable the versatile speaker 16 to deliver the bass performance of DIN-sized speakers while utilizing the smaller JIS basket 16H for purposes of interchangeability.

The surround 16D, which may be made larger than normal, is attached by its outer flange 16C (optionally via a spacer as shown) to a region of the landing surface formed in the basket 16H.

Since the diameter of DIN mounting hole array in panel 18 happens to be equal to the outside diameter of the JIS-sized basket 16H (i.e. 157 mm), a special mounting arrangement is required to mount the JIS-sized basket 16H to the larger mounting pattern of the DIN-configured panel 18.

The '583 patent addressed this DIN mounting problem by utilizing spring metal "saddle" clips 20 to bridge the notches cut out of the basket rim at each of the four mounting hole locations, where the clip 20 is retained by a mounting screw 12A passing through the clip 20 and threadedly engaging panel 18.

Since the larger surround 16D of the DIN-sized cone 16E would interfere with JIS mounting screws in their normal location (as shown in FIG. 2), and it since it may be desired to used even a wider surround than that shown in FIG. 3, the '583 patent addressed this JIS mounting problem by utilizing an adaptor ring configured with JIS mounting holes and with four tabs that mated with rim slots provided in the speaker basket at region 16F; thus with the ring attached to the vehicle panel, the speaker can be attached/removed in a detented manner by rotating the basket.

In FIGS. 2 and 3 as well as in subsequent drawings, diaphragm 10E/16E and attached surround 10D/16D are shown in solid lines in the normal quiescent position of rest, and are shown in dashed lines in the operating condition of having been driven by the voice coil to an extreme limit of excursions, where it is important to ensure sufficient clearance to prevent interference with the metal basket.

The effective diameter of the diaphragm, acting as an air piston, extends well beyond the edge of cone 10E and includes a major portion of the arched suspension 10D which vibrates along with cone 10E.

Figure 4:
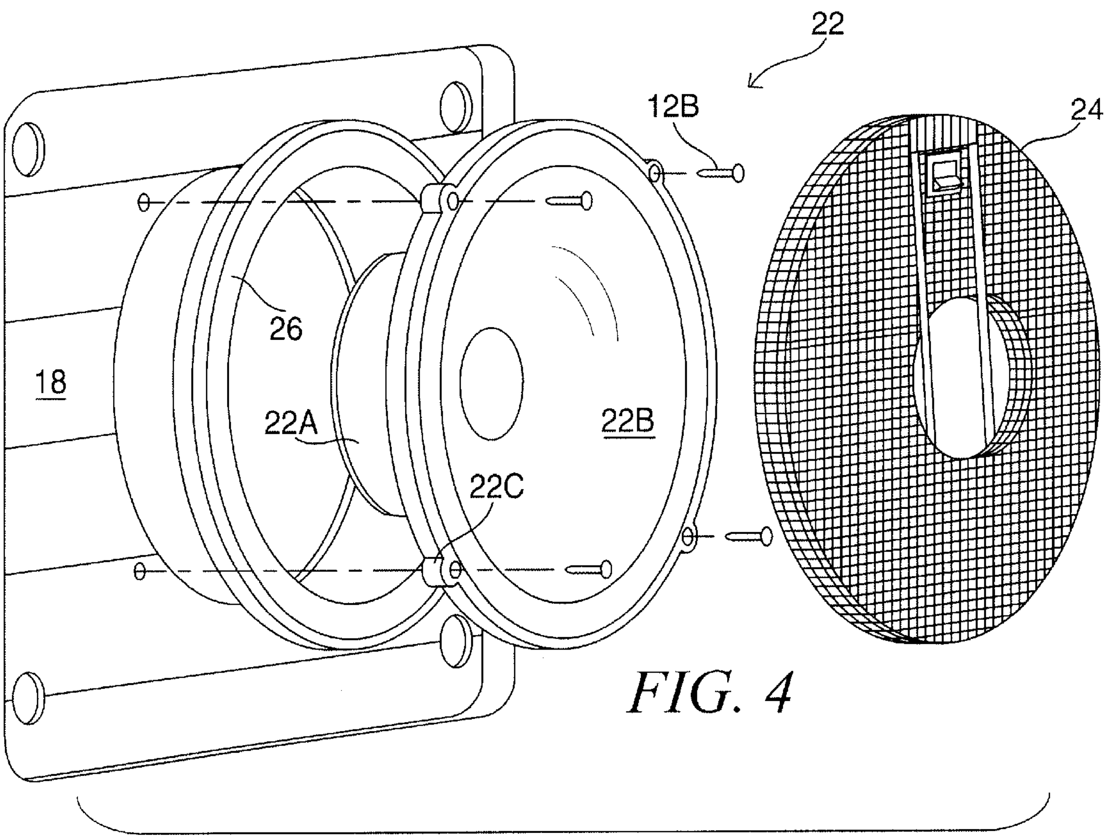
FIG. 4 is a three dimensional view of a dual-standard 6½ inch speaker of the present invention utilizing a special molded plastic basket, shown in pre-installation relationship with a DIN-configured sub-panel, along with a grill cover, associated grill cover mounting ring, and mounting screws.

FIG. 4 is a three-dimensional view of a "dual-standard 6½ inch" speaker 22 of the present invention utilizing a special molded plastic JIS-sized basket 22A fitted with a DIN-sized cone 22B and having four mounting holes in a DIN-configuration polar array whose diameter, 157 mm, coincides with the outside diameter of the JIN-sized basket 22A. At each basket mounting hole location, an ear 22C is formed in the molding process, extending from the perimeter of basket 22A so as to provide an elongated dual purpose mounting opening, centered on the perimeter. (see FIGS. 8A, 8B)

Also shown in FIG. 4 are a protective grill cover 24, an associated flanged grill cover mounting ring 26, four self-tapping basket-mounting screws 12B and sub-panel 18, shown as an example of a removable vehicular sub-panel.

Figure 5:
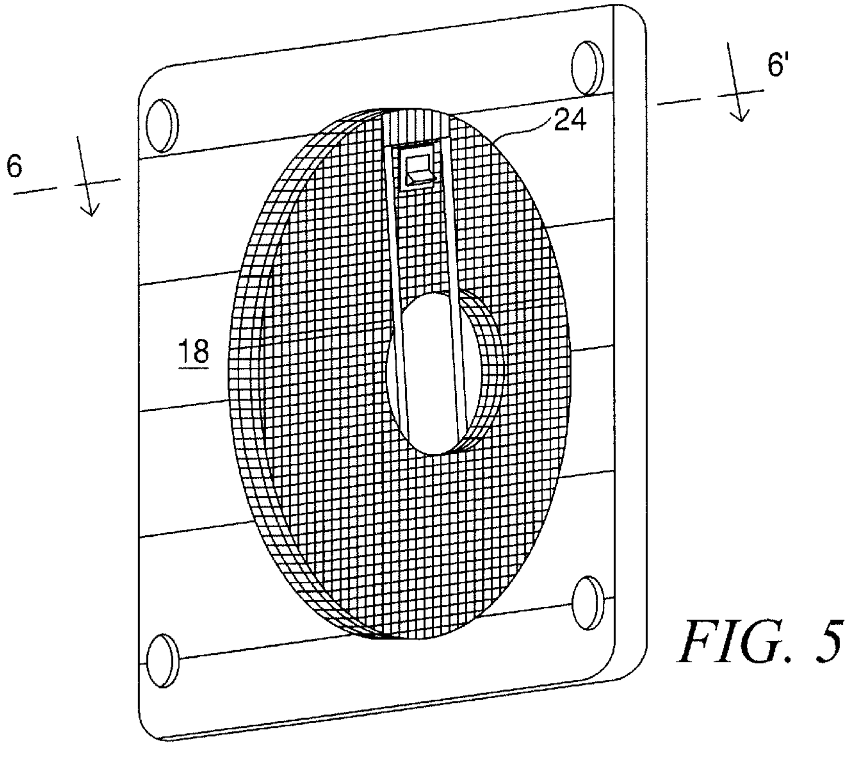
FIG. 5 depicts the items of FIG. 4 assembled together in a vehicular installation.

FIG. 5 depicts grill cover 24 of FIG. 4 assembled to sub-panel 18, along with the speaker and grill cover mounting ring, in a vehicular installation. Grill cover 24 (and its flanged mounting ring 26, FIG. 4) are well known conventional speaker accessory components often utilized with vehicular speakers: they could be added to or omitted from any embodiment of the present invention.

Figure 6:
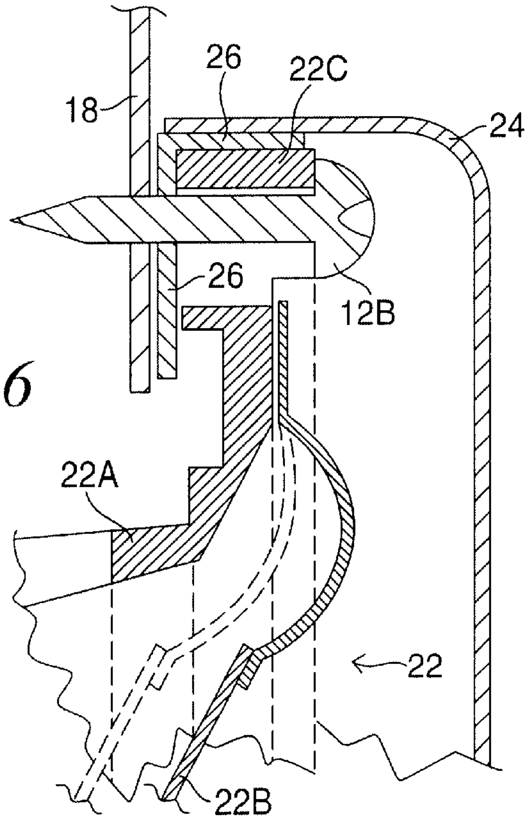
FIG. 6 is a cross-section taken at axis 6–6' of FIG. 5.

FIG. 6 is an enlarged cross-section of the edge of speaker 22, of FIG. 5, taken on axis 6–6' of FIG. 5, through a typical self-tapping speaker-mounting screw 12B which in FIG. 5 is concealed behind grill cover 24. In FIG. 6 screw 12B is seen traversing the hole formed by ear 22C, also traversing the grill cover mounting ring 16, and finally self-tapping into panel 18 so as to secure the JIS-sized dual-standard speaker 22 to the DIN-configured sub-panel 18.

Figure 7:
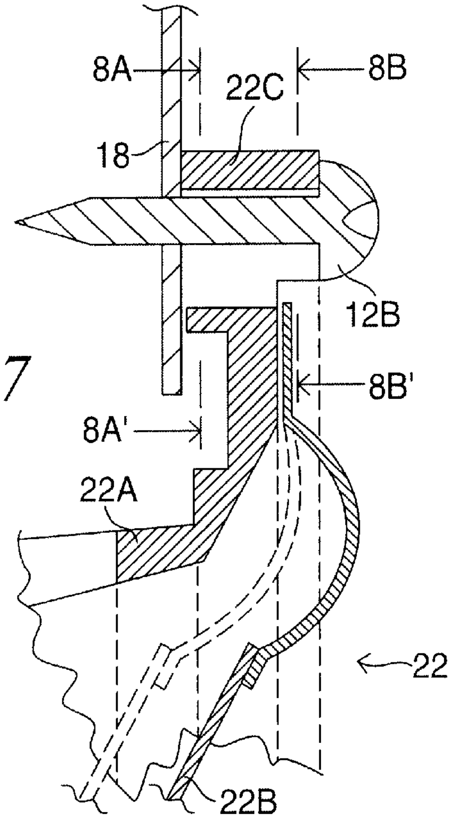
FIG. 7 replicates FIG. 6, omitting the grill cover and its flanged mounting ring.

FIG. 7 substantially replicates FIG. 6 but with the grill cover and its mounting ring omitted, thus showing the basic mounting of a JIS-sized plastic basket 22A of the dual-standard speaker 22 to a DIN-configured sub-panel 18 via self-tapping screws 12B traversing the openings in the mounting ears 22C.

Figure 8A:
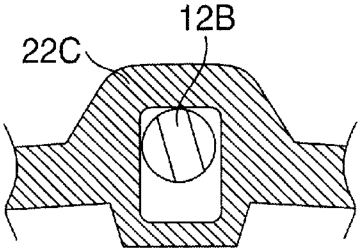
FIG. 8A is a cross-section of a rim portion taken through axis 8A–8A' of FIG. 7 near the rear of the removable mounting ear.

FIG. 8A is a cross-section of a rim portion taken through axis 8A–8A' of FIG. 7 near the rear of the removable mounting ear 22C, showing the elongated mounting hole containing basket-mounting self-tapping screw 12B located at the outermost end region of the elongated hole.

Figure 8B:
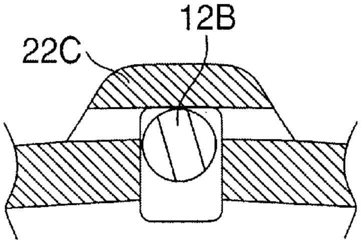
FIG. 8B is a cross-section of a rim portion taken through axis 8B–8B' of FIG. 7 near the front of the removable mounting ear.

FIG. 8B is a cross-section of a rim portion taken through axis 8B–8B' of FIG. 7 near the front of the removable mounting ear 22C, showing a channel configured in the front-facing region enabling ear 22C to be readily removed in a "snap-off" manner if necessary due to surrounding space requirements.

Figure 9:
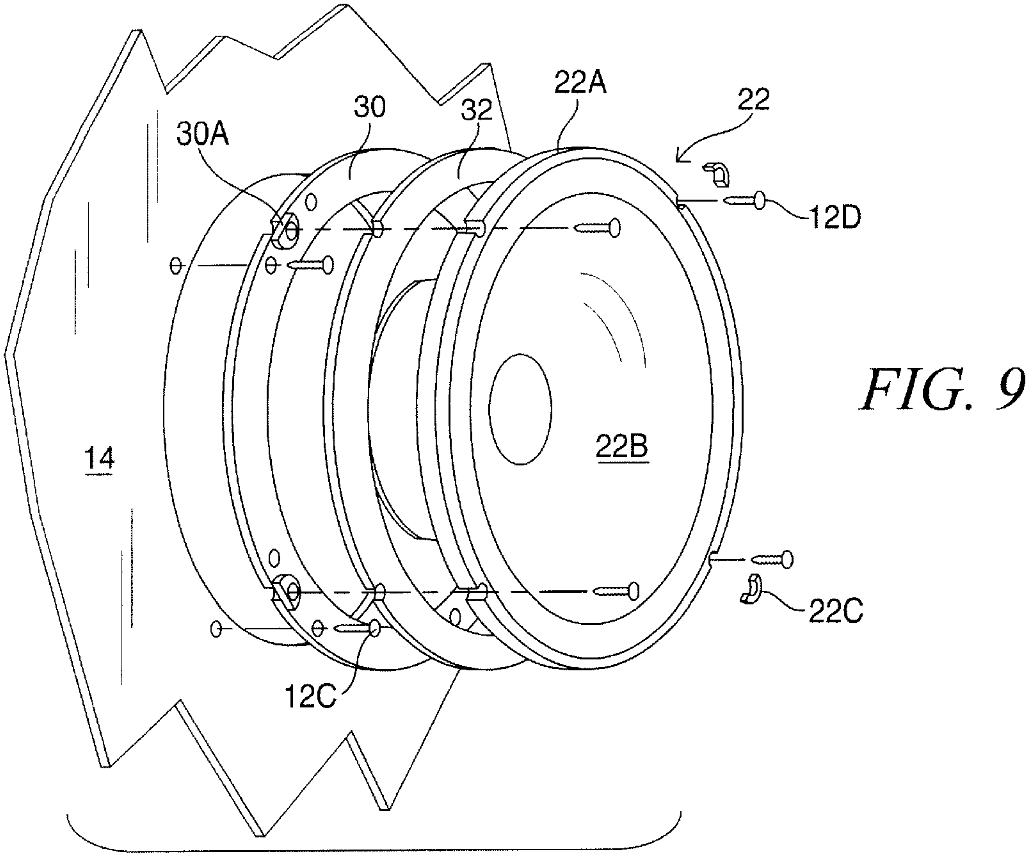
FIG. 9 is a three-dimensional view of the "dual-standard 6½ inch speaker" as in FIG. 4, shown in pre-installation relationship with a JIS-configured mounting panel and mounting hardware.

FIG. 9 is a three-dimensional view of the dual-standard 6½ inch speaker" 22 with JIS-sized plastic basket and DIN-sized cone (as in FIG. 4), shown in pre-installation relationship with a JIS-configured mounting panel 14, along with a mounting adaptor ring 30 of the present invention, four ring-mounting self-tapping screws 12C, an annular gasket 32, and four basket-mounting machine screws 12D. The plastic basket 22A is shown with the four ears 22C removed in the aforementioned "snap-off" manner to avoid interference with nearby surrounding structure in the vehicle.

Ring 30 is formed from sheet metal to have two edge flanges for rigidity and to have four raised regions 30A at the basket-mounting locations, each raised region 30A configured with an extruded threaded hole to engage a corresponding machine screw 12D.

Figure 10:
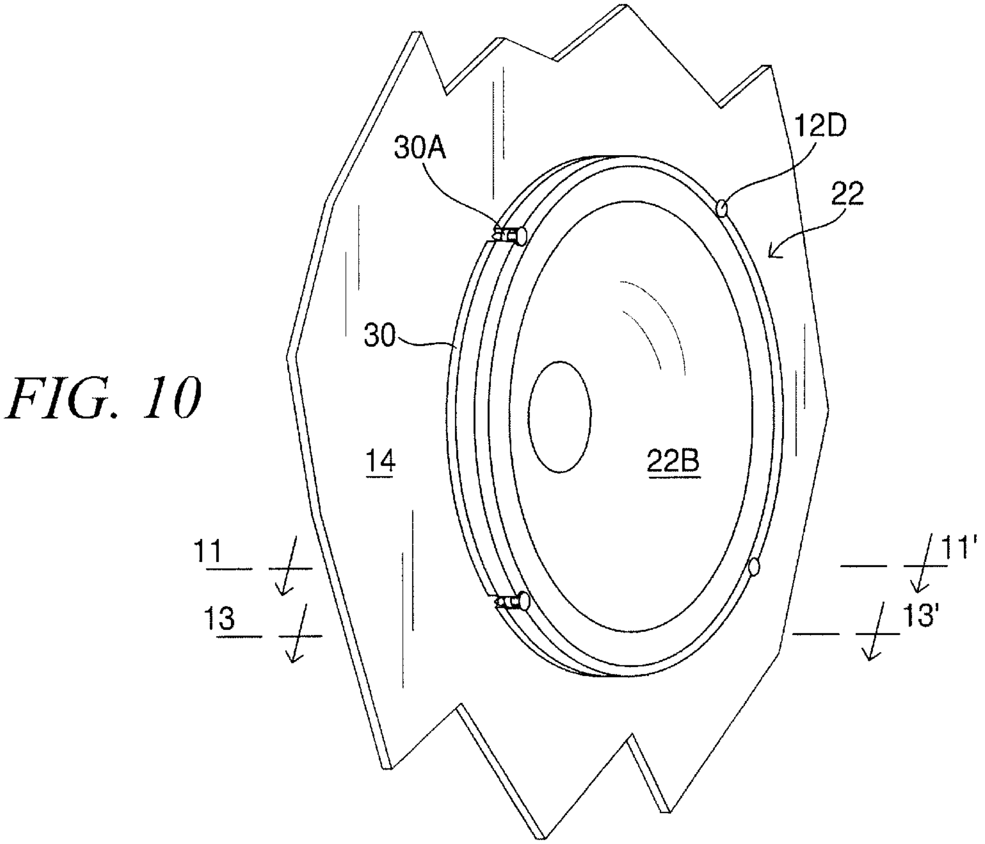
FIG. 10 depicts the speaker of FIG. 9 installed in the panel.

FIG. 10 depicts the items of FIG. 9 with speaker 22 mounted in the JIS-configured panel 14, fastened to ring 30 by the four machine screws 12D. Speaker 22 is displaced from panel 14 due to thickness of the ring 30, approximately 3 mm.

FIG. 11 is an enlarged cross-section of an edge region of speaker 22, taken at axis 11–11' of FIG. 10 through basket-mounting machine screw 12D which engages a threaded extruded hole in the raised portion 30A of ring 30. The mounting ear (22C, FIG. 8) has been removed in a "snap-off" manner to minimize the profile. An optional annular ring foam gasket 32 conforms to the interior space and ensures against air leaks and extraneous noises.

FIG. 12 is a cross-section of a portion of the edge rim of basket 22A of speaker 22, taken at axis 12–12' in FIG. 11. Removal of the ear (22C, FIGS. 8A, 8B) has left a major portion of the mounting opening in which basket-mounting machine screw 12D is seen with its threaded shank located at the bottom of the channel. Machine screw is made to be size #4 and has a washer type head indicated by the dashed outline, engaging the speaker basket rim as shown.

FIG. 13 is an enlarged cross-section taken at axis 13–13' of FIG. 10 through a ring-mounting self-tapping screw 12C (which in FIG. 10 is concealed behind the speaker edge). Ring 30 is secured to panel 14 by self-tapping screw 12C.

FIG. 14 substantially replicates FIG. 11, but shows the mounting ear 22C left in place on basket 22A when there is sufficient clearance space available in the vehicle installation region.

FIG. 15 is a cross-section of a portion of the edge rim of basket 22A of speaker 22, taken through axis 15–15' of FIG. 14 to show the profile of mounting ear 22C with its edge region, separated from the rim of the basket by a pair of small channels, and showing the offset location of the basket-mounting machine screw 12D in the mounting hole.

Figure 16:
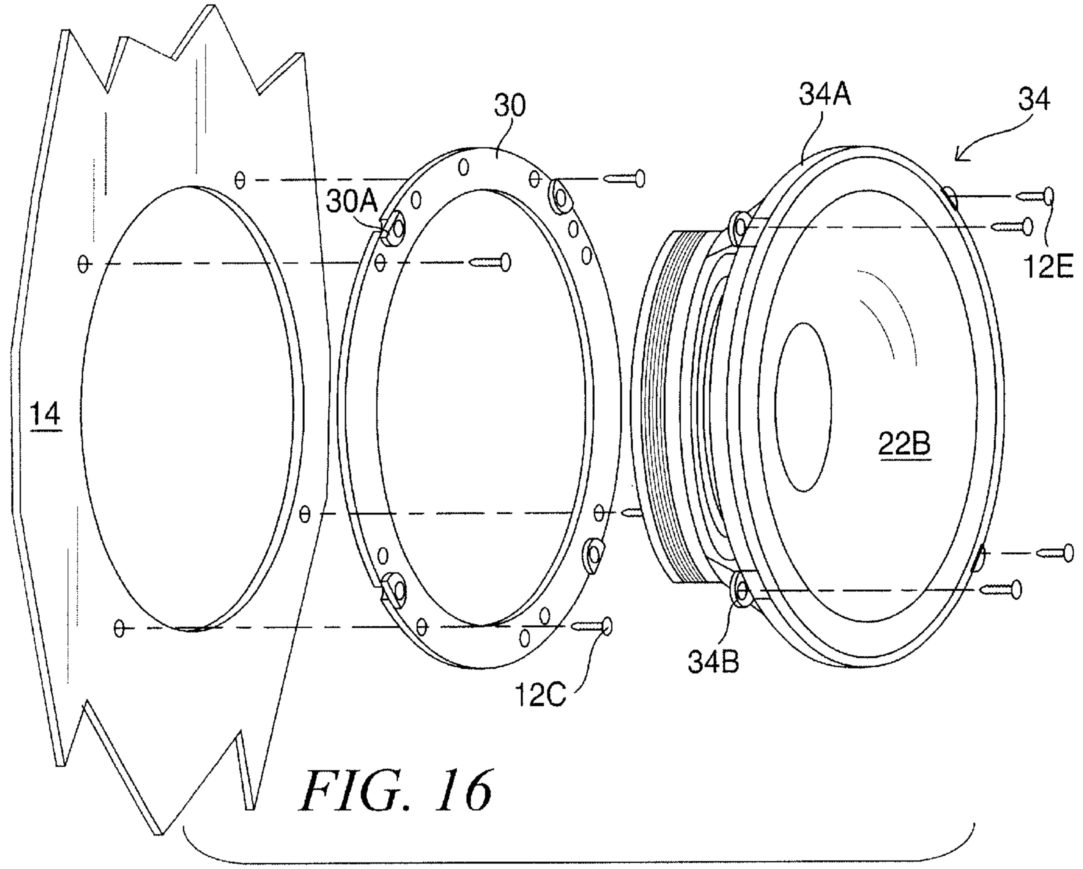
FIG. 16 is a three-dimensional view of a dual-standard 6½ inch speaker of an embodiment of the present invention having a special notched-rim metal JIS-sized basket fitted with a DIN-sized cone, shown in pre-installation relationship with a JIS-configured panel, along with a mounting adaptor ring as in FIG. 9 and associated mounting hardware.

FIG. 16 is a three-dimensional view of a "dual-standard 6½ inch speaker" 34 having a press-formed sheet metal JIS-size basket 34A fitted with a DIN-sized cone 22A, shown in pre-installation relationship with a JIS-configured panel 14, along with the adaptor ring 30 as in FIG. 9 and associated mounting hardware including four basket-mounting machine screws 12E and four ring-mounting self-tapping screws 12C. Adaptor ring is configured with at least eight holes: four threaded (preferably extruded) basket-mounting holes in the raised regions 30A forming a first array located near the perimeter of ring 30 (e.g. on a diameter of 152.5 mm) for attachment to the metal basket 34A of speaker 34, and four ring-mounting clearance holes in a second array, offset rotationally from the first array so as to avoid interference from the raised regions and dimensioned (e.g. on a diameter of 142.5 mm) to match the JIS-configured mounting panel 14. Additional sets of mounting holes may be provided in adaptor ring 30, e.g. to accommodate 3 screw and 6 screw mounting patterns. The amount of rotational offset between the ring-to-panel mounting holes and the basket-to-ring mounting holes is not critical, and the direction of offset may be opposite to that shown.

Material from the rim of basket 34A may be partially separated from the rim at four mounting locations to leave four notches in the rim, where a semi-circular ear or tab 34B is formed to extend beyond the rim and is configured with a DIN-configuration basket mounting hole. Where space is critical, particularly for JIS mounting, these tabs 34B may be bent 90 degrees into the notches, or they may be removed from the basket 34 such as through cutting or by being broken completely off.

Figure 17:
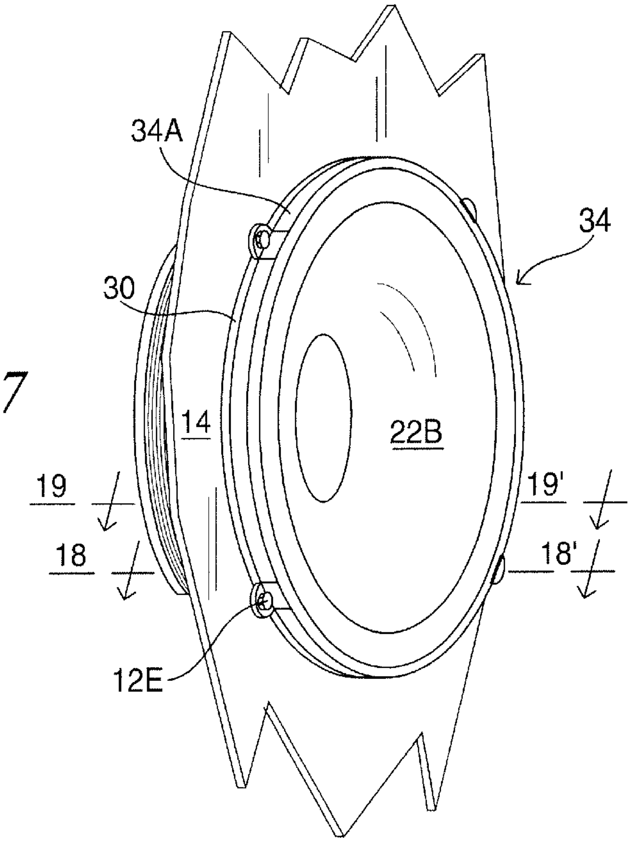
FIG. 17 depicts the speaker of FIG. 16 installed in the panel.

FIG. 17 depicts speaker 34 of FIG. 16 (with JIS-sized basket 34A and DIN-sized cone 22A), installed in the JIS-configured panel 14. Speaker 34 is displaced from panel 14 due to the thickness of the ring 30, approximately 3 mm, (the same as with the plastic embodiment in FIG. 10).

Figure 18A:
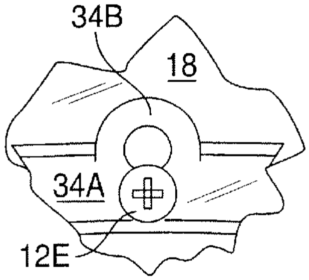
FIG. 18A is a front view of a portion of FIG. 18 around the basket-mounting screw showing the ear formed on the basket.
Figure 18:
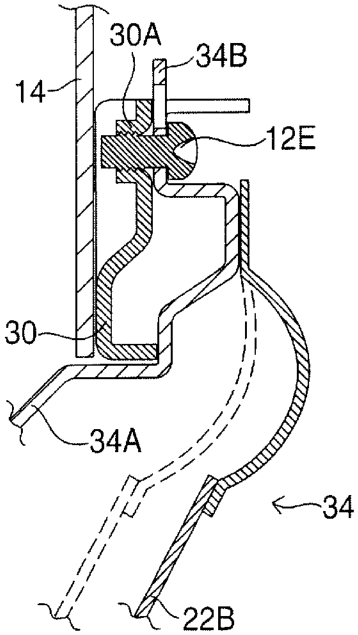
FIG. 18 is a cross-section at axis 18–18' in FIG. 17 showing basket-to-ring fastening with a machine screw.

FIG. 18 is a cross-section at an edge region of speaker 34 taken at axis 18–18' in FIG. 17, showing machine screw 12E attaching metal basket 34A to adaptor ring 30; screw 12E uses a fillister or other small diameter head to fit into the U-channel of the metal basket 34A, which is shaped so as to provide a suitable surface for the head of screw 12E. Attaching the sheet metal basket in this manner opens up the possibility of using self-tapping screws in place of machine screws 12E and thus eliminating the extruding and threading of the mounting holes on ring 30, which are particular requirements relating to the plastic embodiment.

FIG. 18A is a front view of a portion of FIG. 18 around the basket-mounting screw 12E showing the ear 34B formed on the basket 34A. Seen immediately above screw 12E, the DIN pattern mounting hole for the self-tapping speaker-mounting screw is located closely adjacent to the hole for screw 12E. These two holes, which are never required simultaneously, could be combined in a single keyhole-shaped opening or an elongated opening as shown for the plastic basket embodiment in FIGS. 8A and 8B. Alternatively, the four hole array for basket-to-ring screws 34A could be offset rotationally from the four hole DIN mounting array which must be located in the rim gap.

Figure 19:
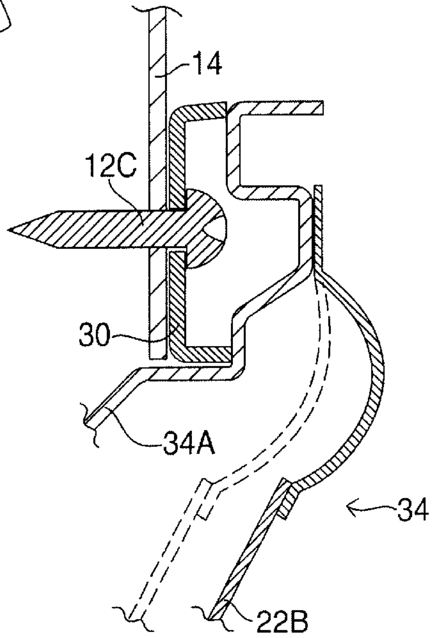
FIG. 19 is a cross-section at axis 19–19' in FIG. 17 showing ring-to-panel fastening with a self-tapping screw.

FIG. 19 is a cross-section at an edge region of speaker 34 taken at axis 19–19' in FIG. 17 through self-tapping screw 12C which attaches adaptor ring 30 to the JIS-configured panel 14; basket 34A is attached to ring 30 as shown in FIG. 18.

Figure 20:
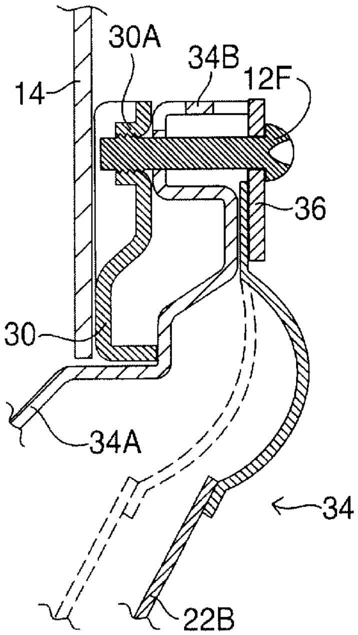
FIG. 20 substantially replicates FIG. 18 showing an alternative basket-mounting machine screw arrangement, with the addition of 4 plates or a front ring.

FIG. 20 substantially replicates FIG. 18 showing an alternative basket-attachment arrangement with the addition of a plate 36 retained by a relatively long machine screw 12F which attaches the basket 34A to ring 30 by drawing plate 36 against the basket rim and the surround flange. Plate 36 can be a small rectangular plate or ring sector, in a quantity of four, one at each basket mounting location; alternatively, plate 36 could be a continuous annular ring which would help preserve the integrity of the adhesive fastening of the surround flange to the landing region on the basket 34A. Ear 34B is shown bent 90 degrees so as to line up with the rim to avoid interference with surrounding items where the JIS mounting space is restricted.

Figure 21A:
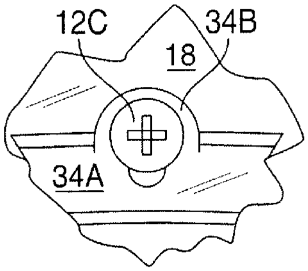
FIG. 21A is front view of a portion of FIG. 21 around the self-tapping screw showing the ear.
Figure 21:
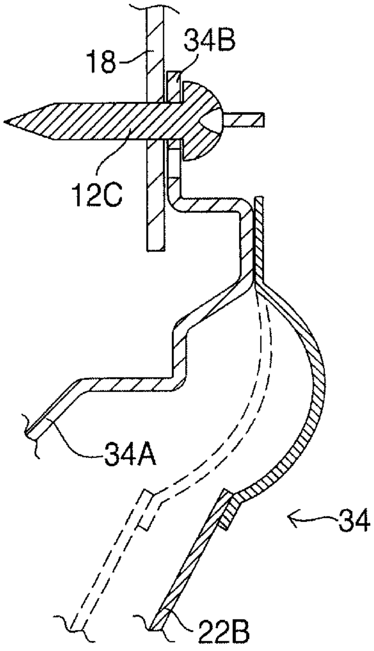
FIG. 21 is a cross-section an edge portion of the metal-basket speaker of FIGS. 16 and 17 showing DIN panel-to-basket mounting with a self-tapping screw utilizing an extending metal ear formed from the basket.

FIG. 21A is front view of the portion of the speaker in FIG. 21 around screw 12C, showing the ear 34B extending from the perimeter of basket 34A, enabling the DIN mounting array of the four speaker mounting screws 12C to be located directly on the perimeter of basket 34A.

The principles of the present invention may be readily practiced in connection with speakers having sizes other than those described above, particularly where the difference in the two speaker sizes is no more than about 10%, with speakers and panels having more or less than four mounting hole locations, and with speaker baskets of oval or other shapes as well as with the round shapes shown in the illustrative embodiments.

The adaptor ring 30 in FIGS. 9–11, 13, 14, 16, 18–20 could be implemented in different forms as a matter of design choice: the directions of the raised portion 30A, flanges and extrusions could be reversed in mirror image fashion, or the adaptor ring 30 could be made of thick solid material, metal or plastic, with the outer set of mounting holes threaded and the inner set recessed to accommodate the screw heads.

In addition to embodiments shown using speaker baskets of molded plastic and of press-formed sheet metal, the invention can lo be practiced with speaker baskets of other material such as cast metal, e.g. aluminum.

Instead of self-tapping screws shown for attachment to panels, other fasteners may be utilized, e.g. wood screws, or machine screws with nuts or T-nuts.

There is potential difficulty obtaining a satisfactory permanent adhesive bond at the interface between the outer surround flange and the basket landing, whether the basket is metal or plastic; for this reason a thin gasket may be inserted in any of the embodiments at this interface to provide the advantage of using different adhesive materials on each side of the gasket. Alternatively such interface gasket can be made to have a designated thickness for mechanical spacing purposes.

Also, as an option, a ring or gasket may be placed onto the exposed surface of the outer surround flange for protective purposes, and this may be mechanically secured in some manner to protect against failure of the adhesive fastening of the outer surround flange to the basket landing.

This invention may be embodied and practiced in other specific forms without departing from the spirit and essential characteristics thereof. The present embodiments therefore are considered in all respects as illustrative and not restrictive. The scope of the invention is indicated by the appended claims rather than by the foregoing description. All variations, substitutions, and changes that come within the meaning and range of equivalency of the claims therefore are intended to be embraced therein.

What is claimed is:

1. A loudspeaker system, comprising:

a basket comprising a rim;

a speaker diaphragm that defines a first air piston area, wherein the speaker diaphragm is coupled to the rim of the basket;

a plurality of ears extending from the rim of the basket, wherein material is removed from at least each ear to define a plurality of closed spaces, wherein the plurality of closed spaces share a common dimension, wherein the common dimension is approximately equal to a multiple of a panel mounting dimension, wherein the panel mounting dimension is set out in a first organization standard, wherein a second organization standard sets out a cone dimension, wherein a second air piston area is a function of the cone dimension, and wherein the first air piston area is greater than the second air piston area; and at least one screw for at least one ear.

2. The loudspeaker system of claim 1, wherein the material removed from an ear defines a hole.

3. The loudspeaker system of claim 2, wherein each ear defines a first position and is configured to be disposed in a second position.

4. The loudspeaker system of claim 3, wherein each ear is configured to be at least one of bent, cut, and broken so as to be disposed in the second position.

5. The loudspeaker system of claim 4, wherein the basket rim and each ear is made of plastic and wherein a channel separates part of each ear from part of the rim.

6. The loudspeaker system of claim 4, wherein each ear is made of metal.

7. The loudspeaker system of claim 2, wherein the hole is a clearance hole, wherein the clearance hole defines a length and a width that is perpendicular to the length, wherein the length is greater than the width, and wherein the width is greater than a diameter of each screw.

8. The loudspeaker system of claim 7, further comprising:

an adaptor ring, wherein the adaptor ring comprises a first interference hole for each clearance hole of the basket, the adaptor ring further comprising a set of second interference holes.

9. The loudspeaker system of claim 8, wherein each first interference hole and second interference hole comprises one of a pilot hole and a threaded hole.

10. The loudspeaker system of claim 8, wherein each ear defines a first position and is configured to be disposed in a second position.

11. The loudspeaker system of claim 10, wherein each ear is configured to be at least one of bent, cut, and broken so as to be disposed in the second position.

12. The loudspeaker system of claim 11, wherein the basket rim and each ear is made of plastic and wherein a channel separates part of each ear from part of the rim.

13. The loudspeaker system of claim 11, wherein each ear is made of metal.

14. The loudspeaker system of claim 1, wherein the second organization standard is issued by the Japanese Industrial Standards Committee (JIS).

15. The loudspeaker system of claim 14, wherein the panel mounting dimension is approximately 157 mm and the multiple is one.

16. The loudspeaker system of claim 1, wherein the speaker diaphragm comprises a speaker cone and a surround, wherein a dimension of the speaker cone is approximately equal to a multiple of a cone dimension set out in the first organization standard.

17. The loudspeaker system of claim 16, wherein the first organization standard is issued by the Deutsches Institut für Normung e.V. (DIN).

18. The loudspeaker system of claim 17, wherein the second organization standard is issued by the Japanese Industrial Standards Committee (JIS).

19. The loudspeaker system of claim 1, wherein the second air piston area is greater than the first air piston area by at least 17%.

20. The loudspeaker system of claim 19, wherein the second air piston area is greater than the first air piston area by approximately 25%.

21. The loudspeaker system of claim 1, wherein material is removed from each ear and the rim of the basket, wherein the first air piston area is a first effective air piston area, wherein the second air piston area is a second effective air piston area, wherein the speaker diaphragm comprises a speaker cone and a surround, wherein the surround comprises an inner flange coupled to the speaker cone, an outer flange that is adhesively coupled to a landing region on the rim of the basket, and an arched suspension disposed between the inner flange and the outer flange.

* * * * *